United States Patent
Kong et al.

(10) Patent No.: US 11,088,354 B2
(45) Date of Patent: Aug. 10, 2021

(54) LIGHT-EMITTING PANEL AND MANUFACTURING METHOD THEREOF

(71) Applicants: Hefei Xinsheng Optoelectronics Technology Co., Ltd., Anhui (CN); BOE Technology Group Co., Ltd., Beijing (CN)

(72) Inventors: Yubao Kong, Beijing (CN); Xuewu Xie, Beijing (CN); Yu Ai, Beijing (CN); Bowen Liu, Beijing (CN); Shi Sun, Beijing (CN); Hao Liu, Beijing (CN); Ameng Zhang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/660,298

(22) Filed: Oct. 22, 2019

(65) Prior Publication Data
US 2020/0321559 A1 Oct. 8, 2020

(30) Foreign Application Priority Data
Apr. 8, 2019 (CN) .......................... 201910278334.8

(51) Int. Cl.
*H01L 27/32* (2006.01)
*H01L 51/52* (2006.01)
(Continued)

(52) U.S. Cl.
CPC ........ *H01L 51/5275* (2013.01); *G02B 3/0031* (2013.01); *H01L 27/3244* (2013.01);
(Continued)

(58) Field of Classification Search
None
See application file for complete search history.

(56) References Cited

U.S. PATENT DOCUMENTS

| 9,112,183 B2 | 8/2015 | Ohta |
| 2007/0254162 A1 | 11/2007 | Kozaki et al. |
(Continued)

FOREIGN PATENT DOCUMENTS

| CN | 1967899 A | 5/2007 |
| CN | 101060165 A | 10/2007 |
(Continued)

OTHER PUBLICATIONS

Aug. 8, 2020—(CN) First Office Action Appn 201910278334.8 with English Translation.

*Primary Examiner* — Asok K Sarkar
(74) *Attorney, Agent, or Firm* — Banner & Witcoff, Ltd.

(57) ABSTRACT

A light-emitting panel and its manufacturing method are provided. The light-emitting panel includes a backboard, an electroluminescence device and an adhesive layer that are sequentially laminated; the light-emitting panel further includes a convex lens array, which includes a plurality of convex lenses on a side of the adhesive layer close to the electroluminescence device. A light-emitting surface of the electroluminescence device faces the adhesive layer, and the plurality of convex lenses included by the convex lens array protrude toward the adhesive layer.

16 Claims, 3 Drawing Sheets

(51) Int. Cl.
   *H01L 51/56* (2006.01)
   *G02B 3/00* (2006.01)
(52) U.S. Cl.
   CPC .......... *H01L 51/5253* (2013.01); *H01L 51/56* (2013.01); *G02B 2003/0093* (2013.01)

(56) References Cited

U.S. PATENT DOCUMENTS

2012/0175648 A1* 7/2012 Kasano ............... H01L 51/5275
  257/88
2012/0218173 A1* 8/2012 Ohta .................. G02B 27/1046
  345/76

FOREIGN PATENT DOCUMENTS

| CN | 102293053 A | 12/2011 |
| CN | 103715363 A | 4/2014 |

\* cited by examiner

LIGHT-EMITTING PANEL AND MANUFACTURING METHOD THEREOF

CROSS REFERENCE TO RELATED APPLICATIONS

The present application claims priority of Chinese Patent Application No. 201910278334.8 filed on Apr. 8, 2019, the disclosure of which is incorporated herein by reference in its entirety as part of the present application.

TECHNICAL FIELD

Embodiments of the present disclosure relates to a light-emitting panel and a manufacturing method of the light-emitting panel.

BACKGROUND

Organic light-emitting diode (abbreviated as OLED) displays are also known as organic electroluminescence displays (abbreviated as OELDs). The organic light-emitting diode displays and thin film transistor liquid crystal displays are products of different types. The former has excellent properties such as self-luminosity, wide viewing angle, high contrast, low power consumption, thin thickness, high response rate, being suitable for flexible panels, wide range of usage temperature, full colorization, relatively simple construction and manufacture and so on, has been acknowledged generally as the mainstream technology of the next generation display, and gets the favors of the major display manufacturers.

SUMMARY

In a first aspect, at least one embodiment of the present disclosure provides a light-emitting panel including a backboard, an electroluminescence device and an adhesive layer that are sequentially laminated; and the light-emitting panel further includes a convex lens array, which includes a plurality of convex lenses on a side of the adhesive layer close to the electroluminescence device. A light-emitting surface of the electroluminescence device faces the adhesive layer, and the plurality of convex lenses included by the convex lens array protrude toward the adhesive layer.

In one or more embodiments of the present application, the light-emitting panel includes a plurality of subpixels, and each of the plurality of subpixels comprises the electroluminescence device; the electroluminescence device includes a light-emitting layer, and an orthographic projection that the convex lens array has on the backboard overlaps an orthographic projection that the light-emitting layer of the electroluminescence device included by at least one of the plurality of subpixels has on the backboard.

In one or more embodiments of the present application, the convex lens array includes the plurality of convex lenses distributed in one-to-one correspondence with the plurality of subpixels, and an orthographic projection that each convex lens among the plurality of convex lenses has on the backboard overlaps the orthographic projection that the light-emitting layer of the electroluminescence device corresponding to the subpixel has on the backboard.

In one or more embodiments of the present application, the light-emitting panel further includes an encapsulation film, the encapsulation film is between the electroluminescence device and the convex lens array, and the encapsulation film directly contacts the adhesive layer and the convex lens array.

In one or more embodiments of the present application, the backboard is a driving circuit board including a driving circuit, and the driving circuit is configured to drive the electroluminescence device to emit light.

In one or more embodiments of the present application, concave patterns are at the side of the adhesive layer close to the electroluminescence device, fillers are respectively provided in the concave patterns, and the fillers are the plurality of convex lenses.

In one or more embodiments of the present application, a refractive index of the fillers is greater than a refractive index of the adhesive layer.

In one or more embodiments of the present application, a refractive index of the plurality of convex lenses is greater than a refractive index of the adhesive layer.

In one or more embodiments of the present application, the plurality of convex lenses are planoconvex lenses, each of the planoconvex lenses includes a planar portion and a curved portion, and the planar portion is between the curved portion and the electroluminescence device.

In one or more embodiments of the present application, the plurality of convex lenses directly contact the electroluminescence device and the adhesive layer.

In one or more embodiments of the present application, the light-emitting panel further includes a cover plate, and focal points of the plurality of convex lenses are at an interface between the cover plate and a medium which is at a side of the cover plate away from the plurality of convex lenses.

In one or more embodiments of the present application, the medium is air.

In one or more embodiments of the present application, the adhesive layer directly contacts the plurality of convex lenses and the cover plate.

In one or more embodiments of the present application, a multilayered adhesive film is adopted as the adhesive layer.

In one or more embodiments of the present application, the plurality of convex lenses in the convex lens array are spaced apart from each other.

In one or more embodiments of the present application, the light-emitting panel further includes an encapsulation film, and the encapsulation film is between the electroluminescence device and the convex lens array; the plurality of convex lenses directly contact the adhesive layer; a refractive index of the plurality of convex lenses is greater than a refractive index of the adhesive layer; portions which are included by the adhesive layer and are in gaps between adjacent ones of the plurality of convex lenses are adhered directly to the encapsulation layer.

In one or more embodiments of the present application, the light-emitting panel further includes a cover plate which is at an outermost side of the light-emitting panel, wherein the adhesive layer directly contacts the cover plate, and focal points of the plurality of convex lenses are at an interface between the cover plate and a medium which is at a side of the cover plate away from the plurality of convex lenses.

In a second aspect, at least one embodiment of the present application provides a manufacturing method of a light-emitting panel, the light-emitting panel includes an electroluminescence device and an adhesive layer which are sequentially laminated, and the method includes: forming a convex lens array on a side of the adhesive layer close to the electroluminescence device by way of transfer printing. A light-emitting surface of the electroluminescence device faces the adhesive layer, and a plurality of convex lenses included by the convex lens array protrude toward the adhesive layer.

In one or more embodiments of the present application, the forming the convex lens array on the side of the adhesive layer close to the electroluminescence device by way of transfer printing includes: by a lens mould, forming concave patterns which are configured for accommodating the convex lens array and are included by an adhesive layer material for forming the adhesive layer; coating fillers on a side of the adhesive layer material formed with the concave patterns, and forming the convex lens array by pre-hardening the fillers; adhering the adhesive layer material with the convex lens array to the electroluminescence device, and forming the adhesive layer by hardening the adhesive layer material.

In one or more embodiments of the present application, the forming the convex lens array on the side of the adhesive layer close to the electroluminescence device by way of transfer printing includes: by a lens mould, forming concave patterns which are configured for accommodating the convex lens array and are included by an adhesive layer material for forming the adhesive layer; printing fillers at the concave patterns, and forming the convex lens array by pre-hardening the fillers; adhering the adhesive layer material with the convex lens array to the electroluminescence device, and forming the adhesive layer by hardening the adhesive layer material.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

It is to be noted that, embodiments in this application and features in the embodiments can be combined with each other in case of no confliction. This application will be described in detail below with reference to the attached drawings and in conjunction with embodiments.

There is a great difference between the external quantum efficiency and the internal quantum efficiency of OLED, and this greatly restricts the development of OLED displays. The light output efficiency of a conventional OLED device is about 20%, and a part of the light emitted from the OLED device is totally reflected at the interface between an adhesive layer and a cover plate and at the interface between the cover plate and air. Therefore, how to improve the light output efficiency of the OLED device and how to reduce the total reflection effect in the OLED device have become the hotspots of research.

The embodiments of the present disclosure provide a light-emitting panel capable of preventing the total reflection phenomenon and effectively increasing the light output amount and provide a manufacturing method of the light-emitting panel.

Figure 1:
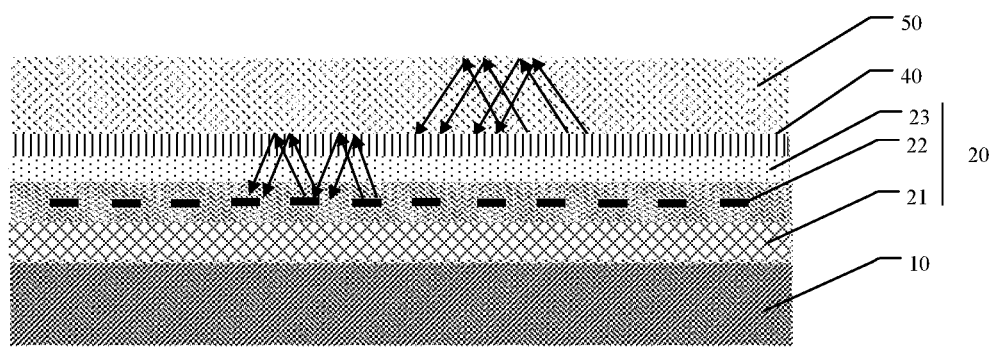
FIG. 1 is an exemplarily structural block diagram illustrating an organic light-emitting display panel.

Please referring to FIG. 1, which is an exemplarily structural block diagram illustrating an organic light-emitting display panel. As shown in FIG. 1, the organic light-emitting display panel known to the inventors of this application includes a backboard 10, an electroluminescence device 20, an adhesive layer 40 and a cover plate 50. The backboard 10 is provided with a driving circuit and a pixel array, and the electroluminescence device 20 includes a cathode 23 (for example, the cathode layer 23 is formed of an alloy of Al and Ag), a light-emitting layer 22 and an anode 21. As shown in FIG. 1, a part of light emitted by the organic light-emitting display panel is totally reflected and refracted at the interface between the cover plate 50 and the adhesive layer 40, and a part of the light refracted undergoes secondary total reflection at the interface between air and the cover plate 50. As a result, the light output amount of the display panel is affected.

Figure 2:
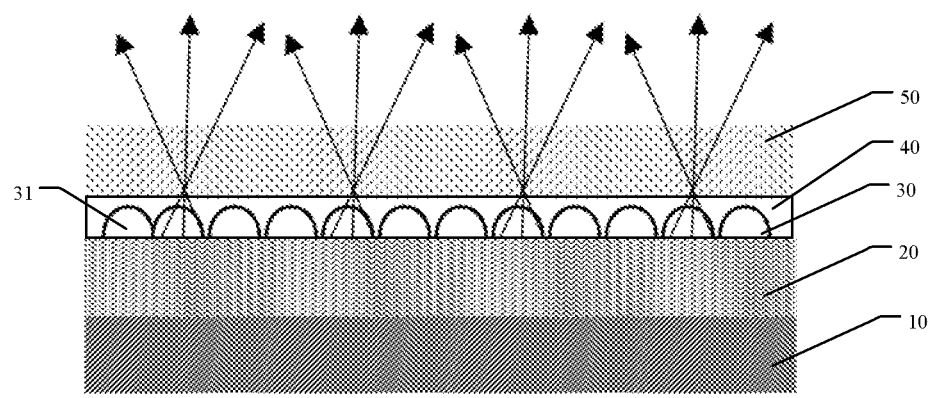
FIG. 2 is an exemplarily structural block diagram illustrating the light-emitting panel according to an embodiment of the present application.
Figure 3A:
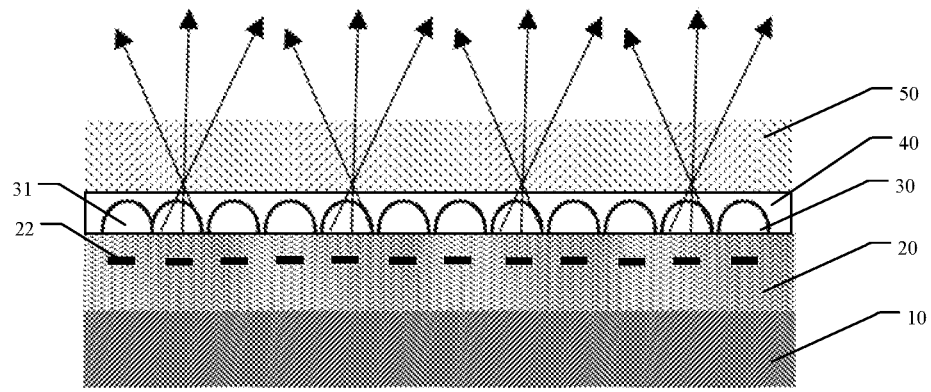
FIG. 3A is an exemplarily structural block diagram illustrating the light-emitting panel according to another embodiment of the present application.
Figure 3B:
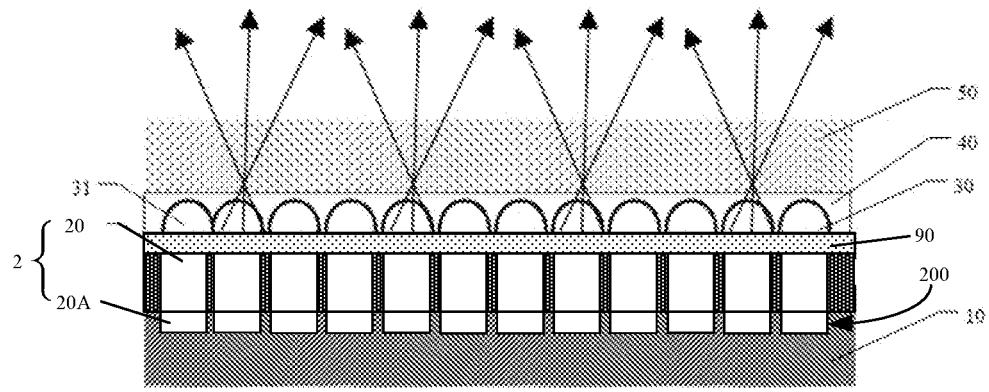
FIG. 3B is an exemplarily structural block diagram illustrating the light-emitting panel according to another embodiment of the present application.

Please referring to FIG. 2 to FIG. 3B, which are exemplarily structural block diagrams illustrating the light-emitting panel according to the embodiments of the present application. As shown in FIG. 2 to FIG. 3B, the light-emitting panel provided by the embodiments of the present disclosure includes a backboard 10, an electroluminescence device 20, an adhesive layer 40 and a cover plate 50, and for example, the cover plate 50 is located at the outermost side of the light-emitting panel. The light-emitting panel further includes a convex lens array 30, which is arranged on a side of the adhesive layer 40 close to the electroluminescence device 20, that is, the convex lens array 30 is located between the electroluminescence device 20 and the adhesive layer 40 in a direction from the backboard 10 to the cover plate 50, and for example, each convex lens 31 in the convex lens array protrudes toward the adhesive layer 40.

In the light-emitting panel shown in FIG. 1, a part of light emitted by the electroluminescence device 20 is totally reflected at the interface between the adhesive layer 40 and the cover plate 50 and at the interface between the cover plate 50 and air, thus affecting the light output amount of the display panel. In this application, the convex lens array is arranged on the side of the adhesive layer 40 close to the electroluminescence device 20, and this changes the light output angle of the organic display panel and reduces the occurrence of total reflection phenomenon.

For example, the light-emitting panel provided by the embodiments of the present disclosure is an organic light-emitting display panel, or the light-emitting panel provided by the embodiments of the present disclosure is a light-emitting panel for illumination or for serving as a backlight source. Embodiments of the present disclosure do not limit the type of the light-emitting panel. For example, the electroluminescence device 20 is an organic light-emitting diode or a light emitter of other type.

The adhesive layer 40 is an adhesive with good light transmittance for bonding a plurality of components. For example, the adhesive layer 40 is an optical adhesive such as an OCA (optically clear adhesive) optical adhesive, or the like. In some embodiments, for example, the optical adhesive used to form the adhesive layer 40 employs a lamination adhesive film (multilayered adhesive film), and such adhesive layer not only has adhesiveness, but also has characteristics of forming an optical element after hardening, and has good light transmittance.

For example, as shown in FIG. 3B, the backboard 10 is a driving circuit board including a driving circuit 200, and the driving circuit 200 is configured to drive the electroluminescent device 20 to emit light; the driving circuit 200 includes a plurality of switches 20A, and each switch 20A is electrically connected with the electroluminescent device 20 included by at least one subpixel (e.g., one subpixel) to control the operational state of the electroluminescent device 20.

For example, as shown in FIG. 3B, the light-emitting panel includes an encapsulation film 90, and the encapsulation film 90 is between the electroluminescent device 20 and the convex lens array 30 and is used for blocking water vapor and oxygen in the air to avoid the influence on the performances of the electroluminescence device 20. For example, the encapsulation film 90 includes at least one inorganic insulating layer and at least one organic insulating layer which are laminated; for example, the encapsulation film 90 has a multilayered film structure in which a plurality of inorganic insulating layers and a plurality of organic insulating layers are alternately laminated. For example, in order to better block the water vapor and the oxygen, the adhesive layer 40 is in direct contact with an organic insulating layer in the encapsulation film 90.

For example, the cover plate 50 is a transparent plate, such as a glass plate, a quartz plate or a plastic plate.

For example, the convex lens array 30 is an array formed of microlenses with a micron-sized light-passing area and a micron-sized embossing depth, that is, each convex lens 31 in the convex lens array 30 has a size greater than or equal to 1 micron and less than 100 microns in the direction from the backboard 10 to the cover plate 50, and a maximum size of an orthographic projection (which is, for example, a circle) of each convex lens on the backboard 10 is greater than or equal to 1 micron and less than 100 microns. In this way, the convex lens array 30 not only has the basic functions of focusing, imaging and the like of a traditional lens, but also has the features of having small-sized convex lens units and high integration of the convex lens units, thus can achieve the functions that cannot be realized by a traditional optical element, and can form many new optical systems.

In some embodiments, as shown in FIG. 3A and FIG. 3B, the light-emitting panel includes the plurality of subpixels 2, each subpixel 2 includes the electroluminescent device 20 and the switch (e.g. a transistor) 20A, and the switch 20A is located in the backboard 10 and is connected with the electroluminescence device 20 to control the on-off state of the electroluminescence device 20. The electroluminescence device 20 includes a light-emitting layer 22, and the orthographic projections that the convex lenses 31 of the convex lens array 30 have on the backboard 10 can cover the orthographic projection that the light-emitting layer in the electroluminescent device of at least one subpixel 20A has on the backboard 10. For example, as shown in FIG. 1, the electroluminescent device 20 further includes an anode 21 and a cathode 23, and the light-emitting layer 22 is located between the anode 21 and the cathode 23. For example, the cathode 23 is located on a side of the anode 21 away from the backboard 10. For example, the cathode 23 is formed of a transparent conductive material (e.g., an alloy of Al and Ag, or indium tin oxide, etc.). For example, cathodes of electroluminescent devices 20 included by the plurality of subpixels 2 are electrically connected directly and anodes of electroluminescent devices 20 included by the plurality of subpixels 2 are spaced apart from each other.

In other words, with regard to the distribution of the convex lenses 31 in the convex lens array 30 and the distribution of the light-emitting layers in the electroluminescence devices included in the subpixels, the following relationship is satisfied: the orthographic projections that the convex lenses 31 in the convex lens array 30 have on the backboard cover the orthographic projection that the light-emitting layer in the electroluminescence device included by at least one subpixel has on the backboard. It is to be noted that, the less the orthographic projection that one convex lens covers and that the light-emitting layer in the electroluminescence device included by the subpixel has on the backboard, the denser the distribution of the convex lenses is, and in this way, the angle of more emitted light can be changed; and the more the orthographic projection that one convex lens covers and that the light-emitting layer in the electroluminescence device of the subpixel has on the backboard, the sparser the distribution of the convex lenses is, and the angle of fewer emitted light can be changed.

In some embodiments, for example, as shown in FIG. 3B, the convex lenses 31 of the convex lens array are distributed in one-to-one correspondence with the subpixels, and the orthographic projection that the convex lens has on the backboard covers the orthographic projection that the light-emitting layer in the electroluminescence device of the subpixel corresponding to the convex lens has on the backboard. That is, as shown in FIG. 3A, the orthographic projection of each convex lens 31 overlaps only the orthographic projection that one light-emitting layer 22 has on the backboard 10, and the orthographic projection of each light-emitting layer 22 overlaps only the orthographic projection of one convex lens 31, so that the distribution of the convex lenses is denser. For example, in other embodiments, the orthographic projection of one light-emitting layer overlaps orthographic projections of at least two convex lenses, and this allows the distribution of the convex lenses to be denser, so as to change the angle of more emitted light.

For example, as shown in FIG. 3A and FIG. 3B, the convex lens array adopts the same distribution as the subpixels, and the orthographic projections of the convex lenses cover the orthographic projections that the light-emitting layers of the electroluminescence devices in the subpixels have on the backboard in a one-to-one correspondence manner. In this way, all the light emitted from the light-emitting layers can be changed by the convex lenses, and thus the total reflection phenomenon of the light emitted from all the subpixels is inhibited.

In some embodiments, the convex lenses 31 may be formed in the following manner: concave patterns are arranged on the side of the adhesive layer 40 close to the electroluminescence device; and afterwards, fillers are provided in the concave patterns respectively, and the fillers are the convex lenses 31. The convex lens 31 is an optical element, which is formed of a transparent material and has at least a portion of its surface being a portion of a spherical surface. When the microlens array is applied to the light-emitting display panel with a multilayered structure, by providing the concave patterns on the side of the adhesive layer 40 and then providing the fillers in the concave patterns to form the convex lenses 31, it is beneficial to implementation or simplification of the process for forming the microlens array (the convex lens array 30).

For example, a refractive index of the filler is greater than a refractive index of the adhesive layer 40, so that the light emitted by the light-emitting layer can be focused after passing through the filler.

For example, a biconvex lens or a planoconvex lens may be adopted as the convex lens. In some embodiments, the convex lens 31 is the planoconvex lens, a planar portion of the planoconvex lens faces the electroluminescence device 20 (for example, the planar portion directly contacts the encapsulation film 90), and a curved portion of the planoconvex lens faces the adhesive layer 40 (for example, the curved portion directly contacts the adhesive layer 40). As shown in FIG. 2 to FIG. 3B, in order to reduce complexity of the manufacturing process, planoconvex lenses are adopted as the convex lenses.

In some embodiments, a focal point of the convex lens 31 (a distance between an optical center of the convex lens and the focal point where light rays meet is a focal length) is substantially located at the interface between the cover plate 50 and a medium (e.g., outside air or other gas, or non-gas medium) located on the side of the cover plate 50 away from the convex lens. When parallel light in the light emitted by the light-emitting layer 22 passes through the convex lens and then is focused on the inside of the cover plate 50 (that is, the focal point of the convex lens 31 is located on a side of the outer surface of the cover plate 50 facing the electroluminescence device 20), a part of the light not perpendicular to the interface between the cover plate and the outside air undergoes a total reflection phenomenon. When the parallel light in the light emitted by the light-emitting layer 22 passes through the convex lens 31 and then is focused on an outside of the cover plate 50 (that is, the focal point of the convex lens 31 is located on a side of the outer surface of the cover plate 50 facing away from the electroluminescence device 20), a part of the light not perpendicular to the interface between the cover plate 50 and the outside air undergoes a total reflection phenomenon. When the light emitted by the light-emitting layer 22 passes through the convex lens 31 and then is focused at the interface between the cover plate and the outside air (that is, the focal point of the convex lens 31 is located at the interface), the occurrence of the total reflection phenomenon can be eliminated entirely.

In some embodiments, for example, the individual convex lenses 31 in the convex lens array 30 are spaced apart from each other. In the embodiments of the present disclosure, in order to increase the degree of adhesion between the adhesive layer 40 and the electroluminescent device 20, the convex lenses 31 are spaced at a certain distance; in this way, the adhesive layer 40 extends into gaps between adjacent convex lenses 31, and portions which are included by the adhesive layer 40 and are in the gaps are directly adhered to the encapsulation film 90. Thus, the adhesion between the adhesive layer 40 and the electroluminescent device 20 is strengthened by the material of the adhesive layer 40 in the gaps between the convex lenses 31.

The embodiments of the present application further provide a manufacturing method of the light-emitting panel, and the light-emitting panel includes the electroluminescence device and the adhesive layer which are arranged sequentially in a laminated manner. The method includes: forming the convex lens array on the side of the adhesive layer close to the electroluminescence device by way of transfer printing, so that the light-emitting surface of the electroluminescence device faces the adhesive layer, and the convex lenses included by the convex lens array protrude toward the adhesive layer. Regarding the setting mode of the electroluminescence device, the adhesive layer and convex lens array in the light-emitting panel, reference may be made to relevant descriptions in the embodiments shown in FIG. 2 to FIG. 3B.

It is to be noted that, the transfer printing technology is a printing technology by which the graphic and text on an intermediate carrier are transferred to a printed object by using a corresponding pressure.

For example, the light-emitting panel provided by the embodiments of the present disclosure is an organic light-emitting display panel, or the light-emitting panel provided by the embodiments of the present disclosure is a light-emitting panel for illumination or for serving as a backlight source. Embodiments of the present disclosure do not limit the type of the light-emitting panel. For example, the electroluminescence device 20 is an organic light-emitting diode or a light emitter of other type.

Figure 4:
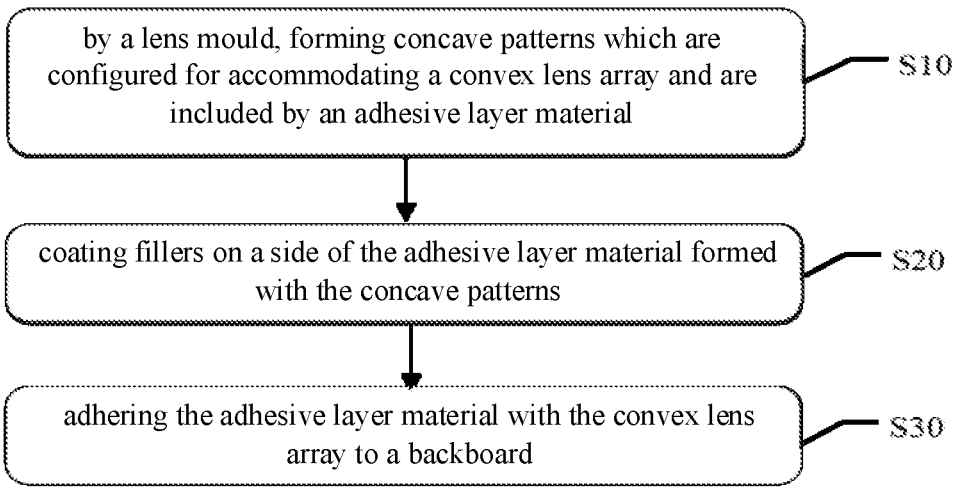
FIG. 4 is an exemplary flowchart illustrating a manufacturing method of the light-emitting panel according to an embodiment of the present application.

FIG. 4 is an exemplary flowchart illustrating the manufacturing method of the light-emitting panel according to an embodiment of the present application. As shown in FIG. 4, in some embodiments, forming the convex lens array on the side of the adhesive layer close to the electroluminescence device by way of transfer printing includes the following steps S10 to S30.

Figure 5:
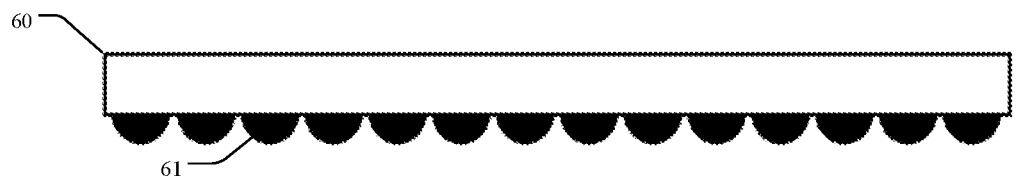
FIG. 5 is an exemplarily structural block diagram illustrating a lens mould according to an embodiment of the present application.
Figure 6:
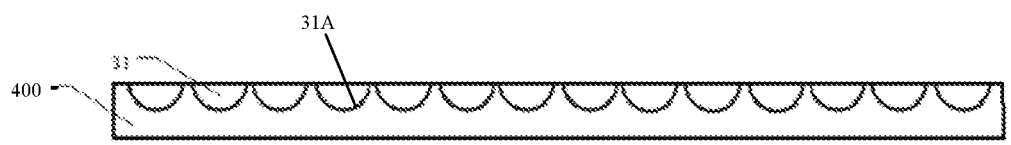
FIG. 6 is an exemplary side view illustrating an adhesive layer material with a convex lens array pattern according to an embodiment of the present application.

Step S10: by a lens mould 60 shown in FIG. 5, forming concave patterns 31A (as shown in FIG. 6) which are configured for accommodating the convex lens array and are included by an adhesive layer material 400 (as shown in FIG. 6, the adhesive layer material 400 are used for forming the adhesive layer).

Step S20: coating fillers on a side of the adhesive layer material 400 formed with the concave patterns 31A, and pre-hardening the fillers (for example, the fillers and the adhesive layer material 400 are all pre-hardened). After the pre-hardening, the filler in each concave pattern 31A forms one convex lens 31, so as to obtain the convex lens array.

Step S30: adhering the adhesive layer material 400 with the convex lens array to the electroluminescence device.

Alternatively, in other embodiments, forming the convex lens array on the side of the adhesive layer close to the electroluminescence device by way of transfer printing includes: by the lens mould 60, forming the concave patterns which are included by the adhesive layer material and are used for accommodating the convex lens array; printing the fillers in the concave patterns, and form the convex lens array by pre-hardening the fillers (for example, the fillers and the adhesive layer material are all pre-hardened); and adhering the adhesive layer material 400 with the convex lens array to the electroluminescence device.

For example, on the basis of the above steps, in the case where the fluidity of the adhesive layer material is good, a step of pre-hardening the adhesive layer material may be added after forming the concave patterns and before forming the fillers in the concave patterns.

Figure 7:
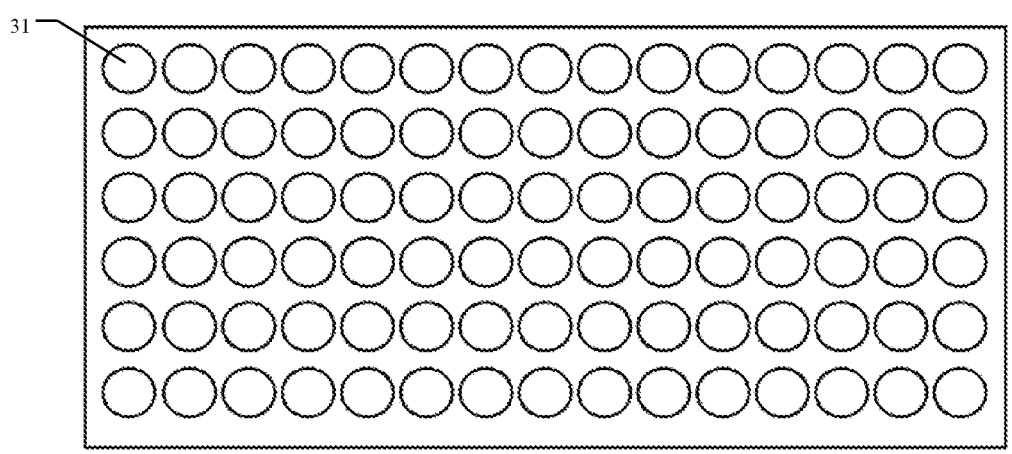
FIG. 7 is an exemplary front view illustrating the adhesive layer material with the convex lens array pattern according to an embodiment of the present application.

Descriptions will be made below with reference to FIG. 5 to FIG. 7. FIG. 5 is an exemplarily structural block diagram illustrating the lens mould according to an embodiment of the present application; FIG. 6 is an exemplary side view illustrating the adhesive layer material with the pattern of the convex lens array according to an embodiment of the present application; and FIG. 7 is an exemplary front view illustrating the adhesive layer material with the pattern of the convex lens array according to an embodiment of the present application.

For example, the lens mould 60 shown in FIG. 5 is adopted in forming the convex lens array, and the lens mould 60 is provided with lens protrusions 61, the distribution of which is the same as that of the convex lens array as needed. By the mould and the pre-hardening, the concave patterns 31A which are shown in FIG. 6 and are included by the material (the adhesive layer material) for forming the adhesive layer are formed, and the front view of the concave patterns is shown in FIG. 7. The fillers are coated on the side of the adhesive layer material 400 formed with the concave patterns 31A, or the fillers are filled in the concave patterns 31A of the adhesive layer material 400 by adopting a printing process; and in these cases, the concave patterns 31A are filled with a light transmissive material (that is, the material of the fillers are the transparent material). Then, the fillers and the adhesive layer material formed with the fillers are subjected to the pre-hardening process to obtain the convex lens array. Afterwards, the patterned adhesive layer material 400 is utilized to adhere the electroluminescence device and the cover plate.

For example, the step of adhering the electroluminescent device and the cover plate by using the adhesive layer material 400 includes: adhering the electroluminescent device to the cover plate by way of the adhesiveness of the pre-hardened adhesive layer material itself filled with the fillers; then, hardening the adhesive layer material again to form the adhesive layer. The temperature of the hardening is greater than the temperature of the pre-hardening.

The adhesive layer 40 is an adhesive with good light transmittance for bonding a plurality of components. For example, the adhesive layer 40 is an optical adhesive such as an OCA (optically clear adhesive) optical adhesive, or the like. In some embodiments, for example, the optical adhesive used to form the adhesive layer 40 employs a lamination adhesive film (multilayered adhesive film), and such adhesive layer not only has adhesiveness, but also has characteristics of forming an optical element after hardening, and has good light transmittance.

For example, as shown in FIG. 3B, the backboard 10 is a driving circuit board including the driving circuit 200, and the driving circuit 200 is configured to drive the electroluminescent device 20 to emit light; the driving circuit 200 includes the plurality of switches 20A, and each switch 20A is electrically connected with the electroluminescent device 20 included by at least one subpixel (e.g., one subpixel) to control the operational state of the electroluminescent device 20.

For example, as shown in FIG. 3B, the light-emitting panel includes the encapsulation film 90, and the encapsulation film 90 is between the electroluminescent device 20 and the convex lens array 30 and is used for blocking water vapor and oxygen in the air to avoid the influence on the performances of the electroluminescence device 20. For example, the encapsulation film 90 includes at least one inorganic insulating layer and at least one organic insulating layer which are laminated; for example, the encapsulation film 90 has a multilayered film structure in which a plurality of inorganic insulating layers and a plurality of organic insulating layers are alternately laminated. The adhesive layer 40 directly contacts the encapsulation film 90. For example, in order to better block the water vapor and the oxygen, the adhesive layer 40 is in direct contact with an organic insulating layer in the encapsulation film 90.

In the embodiments of this application, the light output angle of the light emitted by the electroluminescence device can be changed by providing the convex lens array on the side of the adhesive layer close to the electroluminescence device, so as to prevent the total reflection of the light occurring at the interface of the adhesive layer and the cover plate and at the interface between the cover plate and air. For example, according to some embodiments of the present application, the convex lens array is formed on the side of the adhesive layer close to the electroluminescence device by way of the transfer printing process, and prevention of total reflection can be realized without changing the original structure of the display panel. Thus, effects of being simple and easy to operate are obtained.

What are described above is related to the illustrative embodiments of the disclosure only and not limitative to the scope of the disclosure; the scopes of the disclosure are defined by the accompanying claims.

What is claimed is:

1. A light-emitting panel, comprising:
  a backboard, an electroluminescence device and an adhesive layer that are sequentially laminated; and
  a convex lens array, which comprises a plurality of convex lenses on a side of the adhesive layer close to the electroluminescence device,
  wherein a light-emitting surface of the electroluminescence device faces the adhesive layer, and the plurality of convex lenses protrude toward the adhesive layer,
  wherein the light-emitting panel further comprises a cover plate, wherein focal points of the plurality of convex lenses are at an interface between the cover plate and a medium which is at a side of the cover plate away from the plurality of convex lenses.

2. The light-emitting panel according to claim 1, wherein the light-emitting panel comprises a plurality of subpixels, and each of the plurality of subpixels comprises the electroluminescence device,
  the electroluminescence device comprises a light-emitting layer, and an orthographic projection that the convex lens array has on the backboard overlaps an orthographic projection that the light-emitting layer of the electroluminescence device comprised by at least one of the plurality of subpixels has on the backboard.

3. The light-emitting panel according to claim 2, wherein the convex lens array comprises the plurality of convex lenses distributed in one-to-one correspondence with the plurality of subpixels, and an orthographic projection that each convex lens of the plurality of convex lenses has on the backboard overlaps the orthographic projection that the light-emitting layer of the electroluminescence device corresponding to a subpixel has on the backboard.

4. The light-emitting panel according to claim 1, further comprising an encapsulation film, wherein the encapsulation film is between the electroluminescence device and the convex lens array, and the encapsulation film directly contacts the adhesive layer and the convex lens array.

5. The light-emitting panel according to claim 1, wherein the backboard is a driving circuit board comprising a driving circuit, and the driving circuit is configured to drive the electroluminescence device to emit light.

6. The light-emitting panel according to claim 1, wherein concave patterns are at the side of the adhesive layer close to the electroluminescence device, fillers are respectively provided in the concave patterns, and the fillers are the plurality of convex lenses.

7. The light-emitting panel according to claim 6, wherein a refractive index of the fillers is greater than a refractive index of the adhesive layer.

8. The light-emitting panel according to claim 1, wherein a refractive index of the plurality of convex lenses is greater than a refractive index of the adhesive layer.

9. The light-emitting panel according to claim 1, wherein the plurality of convex lenses are planoconvex lenses, each of the planoconvex lenses comprises a planar portion and a curved portion, and the planar portion is between the curved portion and the electroluminescence device.

10. The light-emitting panel according to claim 1, wherein the plurality of convex lenses directly contact the electroluminescence device and the adhesive layer.

11. The light-emitting panel according to claim 1, wherein the medium is air.

12. The light-emitting panel according to claim 1, wherein the adhesive layer directly contacts the plurality of convex lenses and the cover plate.

13. The light-emitting panel according to claim 1, wherein a multilayered adhesive film is adopted as the adhesive layer.

14. The light-emitting panel according to claim 1, wherein the plurality of convex lenses are spaced apart from each other.

15. The light-emitting panel according to claim 1, further comprising an encapsulation film, wherein
the encapsulation film is between the electroluminescence device and the convex lens array,
the plurality of convex lenses directly contact the adhesive layer,
a refractive index of the plurality of convex lenses is greater than a refractive index of the adhesive layer, and
portions which are comprised by the adhesive layer and are in gaps between adjacent ones of the plurality of convex lenses are adhered directly to the encapsulation film.

16. The light-emitting panel according to claim 15, wherein the cover plate is at an outermost side of the light-emitting panel, and the adhesive layer directly contacts the cover plate.

* * * * *